United States Patent
An et al.

(10) Patent No.: US 9,306,782 B2
(45) Date of Patent: Apr. 5, 2016

(54) SYSTEMS AND METHODS FOR NARROWBAND SIGNAL QUADRATURE ERROR CORRECTION

(71) Applicant: Analog Devices, Inc., Norwood, MA (US)

(72) Inventors: Wei An, Newton, MA (US); Yosef Stein, Sharon, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/657,029

(22) Filed: Mar. 13, 2015

(65) Prior Publication Data
US 2015/0288549 A1 Oct. 8, 2015

Related U.S. Application Data

(60) Provisional application No. 61/976,393, filed on Apr. 7, 2014.

(51) Int. Cl.
*H04L 27/38* (2006.01)
*H04L 27/227* (2006.01)
*H04L 7/00* (2006.01)
*H03D 3/00* (2006.01)

(52) U.S. Cl.
CPC .......... *H04L 27/2276* (2013.01); *H04L 7/0079* (2013.01); *H04L 27/3863* (2013.01); *H03D 3/009* (2013.01)

(58) Field of Classification Search
CPC ............ H04L 27/3863; H04L 27/2276; H04L 7/0079; H03D 3/009
See application file for complete search history.

(56) References Cited

U.S. PATENT DOCUMENTS

| | | | | |
|---|---|---|---|---|
| 5,774,375 | A   * | 6/1998  | Behrent ........................ | 702/106 |
| 9,030,340 | B1 * | 5/2015  | Waltari ......................... | 341/118 |
| 2004/0217753 | A1 * | 11/2004 | Yamanaka et al. ......... | 324/76.21 |
| 2009/0323861 | A1 * | 12/2009 | Safavi ........................... | 375/302 |
| 2012/0270516 | A1 * | 10/2012 | Kang et al. .................. | 455/233.1 |
| 2012/0300818 | A1 * | 11/2012 | Metreaud et al. ............ | 375/219 |
| 2013/0243129 | A1 * | 9/2013  | Okuni et al. .................. | 375/320 |
| 2013/0243131 | A1   | 9/2013  | An et al. | |
| 2014/0307839 | A1 * | 10/2014 | Tsai .................... | H04L 27/2688 375/349 |

* cited by examiner

*Primary Examiner* — Jean B Corrielus
(74) *Attorney, Agent, or Firm* — Knobbe, Martens, Olson & Bear, LLP (57) ABSTRACT

Apparatus and method for quadrature error correction for narrowband or tone signal are disclosed. An analog circuit receives a modulated signal and processes in-phase signal and quadrature-phase signal in in-phase and quadrature-phase signal paths respectively. A digital signal processor performs discrete Fourier transform on each of the in-phase and quadrature-phase signals and determines statistical parameters responsive to mismatch characteristics to estimate quadrature error correction.

20 Claims, 8 Drawing Sheets

SYSTEMS AND METHODS FOR NARROWBAND SIGNAL QUADRATURE ERROR CORRECTION

CROSS-REFERENCE TO RELATED APPLICATION

This application claims the benefit under 35 U.S.C. §119 (e) of U.S. Provisional Application No. 61/976,393, filed Apr. 7, 2014, the entirety of which is hereby incorporated by reference.

BACKGROUND

1. Field of the Invention

The invention generally relates to electronics, and in particular, to narrowband signal quadrature correction.

2. Description of the Related Art

Electronic systems such as receivers may use in-phase (I) and quadrature-phase (Q) signal processing since various wireless communication protocols depend on I/Q signal processing. When processing I/Q signals at a receiver, quadrature error often occurs due to various imperfections and asymmetries. To correct the quadrature error for narrowband or tone signal, a tone-calibration method may be used. However, such method does not provide a real time solution and may not adapt to changes in environmental conditions.

SUMMARY

The systems, methods, and devices of the invention each have several aspects, no single one of which is solely responsible for its desirable attributes.

One embodiment includes an apparatus for processing a modulated signal, the apparatus comprising a quadrature demodulator configured to receive the modulated signal and generate an in-phase signal for a first signal path and a quadrature-phase signal for a second signal path, and a signal processor comprising a discrete Fourier transform module configured to generate one or more frequency domain values based on the in-phase signal from the first path and the quadrature-phase signal from the second path, a computation module configured to determine a plurality of statistical parameters responsive to one or more mismatch characteristics between the in-phase signal and the quadrature-phase signal based at least partly on the one or more frequency domain values, an analysis module configured to determine the one or more mismatch characteristics based on the plurality of statistical parameters, and a correction module configured to reduce quadrature error based on the one or more mismatch characteristics.

Another embodiment includes a method for processing a modulated signal, the method comprising receiving the modulated signal and generating an in-phase signal for a first signal path and a quadrature-phase signal for a second signal path, generating one or more frequency domain values based on the in-phase signal from the first path and the quadrature-phase signal from the second path, determining a plurality of statistical parameters responsive to one or more mismatch characteristics between the in-phase signal and the quadrature-phase signal based at least partly on the one or more frequency domain values, determining the one or more mismatch characteristics based on the plurality of statistical parameters, and correcting the in-phase signal and/or the quadrature-phase signal based on the one or more mismatch characteristics to reduce quadrature error.

BRIEF DESCRIPTION OF THE DRAWINGS

These drawings and the associated description herein are provided to illustrate embodiments of the invention and are not intended to be limiting.

DETAILED DESCRIPTION

Various aspects of the novel systems, apparatuses, and methods are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. In addition, the scope is intended to cover such an apparatus or method which is practiced using other structure, functionality, or structure and functionality in addition to or other than the various aspects set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wired and wireless technologies, system configurations, networks, including optical networks, hard disks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

Figure 1:
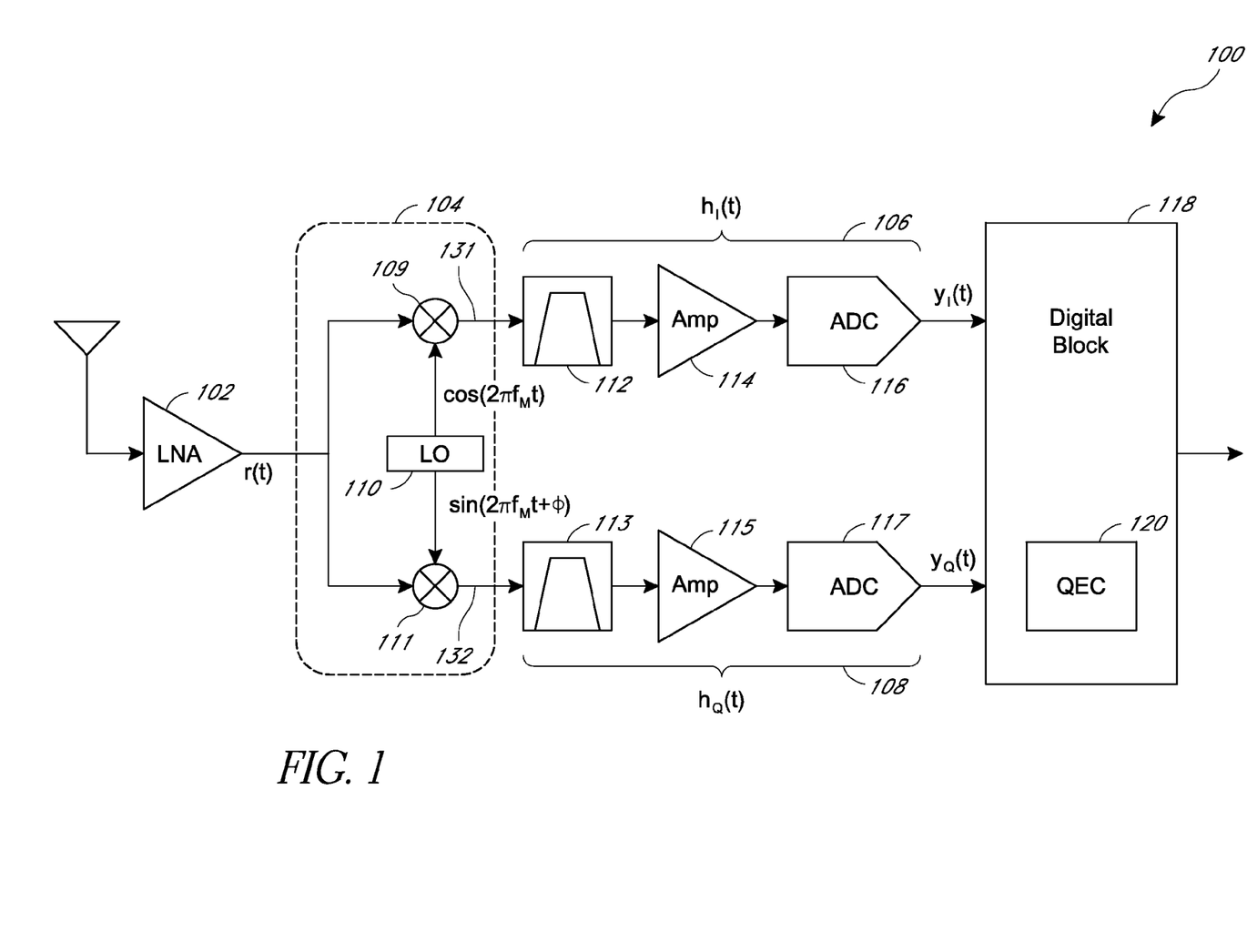
FIG. 1 is a schematic block diagram illustrating an example receiver system with narrowband signal quadrature correction in accordance with one embodiment.

Referring to FIG. 1, an example receiver system with narrowband signal quadrature correction will be described below. The receiver system 100 may comprise a low noise amplifier (LNA) 102, a quadrature demodulator 104, an in-phase signal path 106, a quadrature phase signal path 108, a digital block 118, and a quadrature error corrector (QEC) 120. The quadrature demodulator 104 may further comprise a local oscillator (LO) 110, mixers 109, 111, and each of the in-phase signal path 106 and the quadrature phase signal path 108 may comprise a filter 112 or 113, an amplifier 114 or 115, and an analog to digital converter (ADC) 116 or 117.

In one embodiment, the LNA 102 may amplify its input signal and generate an output r(t), which may be a modulated signal. The modulated signal may be further expressed as $r(t)=2Re[z(t)e^{j2\pi f_c t}]=z(t)e^{j2\pi f_c t}+z(t)^* e^{-j2\pi f_c t}$ where $z(t)=z_I(t)+jz_Q(t)$ may be a baseband signal and $f_c$ is a carrier frequency. The modulated signal r(t) may be a narrowband signal with a bandwidth of, for example, 25 kilohertz (kHz), or a tone signal having a single frequency. The signal bandwidth may range from 0 to 50 kHz as appropriate for IEEE 802.15.4g. The quadrature demodulator 104 can be configured as a direct downconverter. In alternative embodiments, the quadrature demodulator 104 can be used in an intermediate frequency path following a separate downconverter. The quadrature demodulator 104 may generate an in-phase mixer output 131 and quadrature phase mixer output 132 by mixing the modulated signal with signals generated by the LO 110. In this example, the in-phase mixer output 131 is generated by mixing the modulated signal r(t) with an in-phase oscillator signal $\cos(2\pi f_M t)$, and the quadrature phase mixer output 132 is generated by mixing the modulated signal r(t) with a quadrature-phase oscillator signal $\sin(2\pi f_M t+\phi)$. Ideally, the LO 110 generates the in-phase oscillator signal and the quadrature phase oscillator signal with a phase difference of 90 degrees between the two. For example, a first oscillator signal can be generated, and a second oscillator signal can be a phase shifted version of the first oscillator signal. A relative phase error or mismatch between the in-phase oscillator signal and the quadrature-phase oscillator signal generated by the LO 110 is modeled as $\phi$ in the quadrature-phase oscillator signal $\sin(2\pi f_M t-\phi)$. Ideally, the relative phase error $\phi$ is zero. The in-phase oscillator signal and the quadrature-phase oscillator signal may further have relative magnitude error or mismatch, and such magnitude mismatch may be modeled as a multiplier $g_{LO}$ (not shown) to the quadrature-phase oscillator signal. Other ways to model quadrature errors will be applicable.

The in-phase mixer output 131 may be further processed though the filter 112, the amplifier 114, and the ADC 116 in the in-phase signal path 106. Similarly, the quadrature-phase mixer output 132 may be further processed through the filter 113, the amplifier 115, and the ADC 117 in the quadrature-phase signal path 108. The filter 112 or 113 in each of the in-phase and quadrature-phase signal paths 106 and 108 may be a lowpass filter with a cut-off frequency of 200 kHz or a bandpass filter with a passband of 50 to 150 kHz, for example, to separate the demodulated baseband signals from RF signals and to prevent aliasing. The passband or bandwidth of the bandpass filter may be chosen so that the channel mismatch within the bandwidth can be constant. An example bandwidth can be 100 kHz. The amplifier 114 or 115 in each of the in-phase and quadrature-phase signal paths 106 and 108 may amplify the output of the filter 112 or 113, and the ADC 116 or 117 in each of the in-phase and quadrature-phase signal paths 106 and 108 may convert the output of the amplifier 114 or 115, which is analog, to a digital signal. In some embodiments, the output of the amplifier 114 or 115 can be a current, and the ADCs 116, 117 can have a current input. In this example, the time domain function of the in-phase signal path 106 is represented as $h_I(t)$, and the time domain function of the quadrature-phase signal path 108 is represented as $h_Q(t)$. Since the electrical characteristics of the in-phase signal path 106 and the quadrature-phase signal path 108 are typically not identical in a practical receiver, in addition to the magnitude and phase error from the quadrature demodulator 104 previously described, there can be an additional mismatch between $h_I(t)$ and $h_Q(t)$. The relative mismatch between $h_I(t)$ and $h_Q(t)$ may be expressed as a single time domain function $h_D(t)$. The signal from the in-phase signal path 106 may be an in-phase signal input to the digital block 118, and the signal from the quadrature-phase signal path 108 may be a quadrature-phase signal input to the digital block 118. In this example, the time domain function of the in-phase signal is represented as $y_I(t)$ and the time domain function of the quadrature-phase digital signal is represented as $y_Q(t)$.

In this example, the general input signal y(t) to the digital block 118 may be modeled in the time domain as below:

$$y(t) = y_I(t) + jy_Q(t)$$
$$= z_I(t) + j(\cos(\phi)z_Q(t) - \sin(\phi)z_I(t)) \otimes h_D(t)$$
$$= z(t) \otimes g_1(t) + z^*(t) \otimes g_2(t)$$

where $g_1(t) = \frac{1}{2}(1 + e^{-j\phi}h_D(t))$, $g_2(t) = \frac{1}{2}(1 - e^{j\phi}h_D(t))$, and $h_D(t) = h_Q(t) \otimes h_I^{-1}(t)$.

Accordingly, the frequency domain model of the input Y(f) to the digital block 118 is as below:

$$Y(f) = Z_I(f) + j(\cos(\phi)Z_Q(f) - \sin(\phi)Z_I(f))H_D(f)$$
$$= Z(f)G_1(f) + Z^*(-f)G_2(f)$$

where $G_1(f) = \frac{1}{2}(1 + e^{-j\phi}H_D(f))$, $G_2(f) = \frac{1}{2}(1 - e^{j\phi}H_D(f))$, and $H_D(f) = H_Q(f)/H_I(f)$.

As discussed above, the modulated signal may be a narrowband signal or a tone signal. For example, if the modulated signal is a tone signal, the signal z(t) may be modeled in the time domain as below, where $r(t)=2Re[z(t)e^{j2\pi f_c t}]=z(t)e^{j2\pi f_c t}+z(t)^* e^{-j2\pi f_c t}$ and $z(t)=z_I(t)+jz_Q(t)$ may be a baseband signal and $f_c$ is a carrier frequency.

$$z(t) = z_I(t) + jz_Q(t)$$
$$= \cos(\omega t + \xi) + j\sin(\omega t + \xi)$$

where $\omega=2\pi f_c$, $f_c$ is a carrier frequency, and $\xi$ is a phase of the baseband signal z(t).

For the tone, the effect of the relative mismatch function $h_D(t)$ is to add an additional mismatch phase $\theta$ and a mismatch gain A to the tone. The signal y(t) becomes, $$y(t) = \cos(\omega t + \xi) + jA(\cos(\phi)\sin(\omega t + \xi + \theta) - \sin(\phi)\cos(\omega t + \xi + \theta))$$
$$= \cos(\omega t + \xi) + jA\sin(\omega t + \xi + \theta - \phi)$$
$$= \cos(\omega t + \xi) + jA\sin(\omega t + \xi - \varphi)$$
$$= \cos(\omega t + \xi) + jA\cos(\varphi)(\sin(\omega t + \xi) - \tan(\varphi)\cos(\omega t + \xi))$$

where $\varphi=\phi-\theta$ is a combined phase mismatch. Further analysis of a similarly modeled tone signal is discussed below in connection with FIG. 3.

Taking in the input signals as modeled above, the digital block 118 may further process its input signals before they are provided as inputs to the QEC 120. The QEC 120 may be configured to process the input signals to estimate the parameters A and φ above. The QEC 120 will be described in greater detail later in connection with FIGS. 2 and 3.

Figure 2:
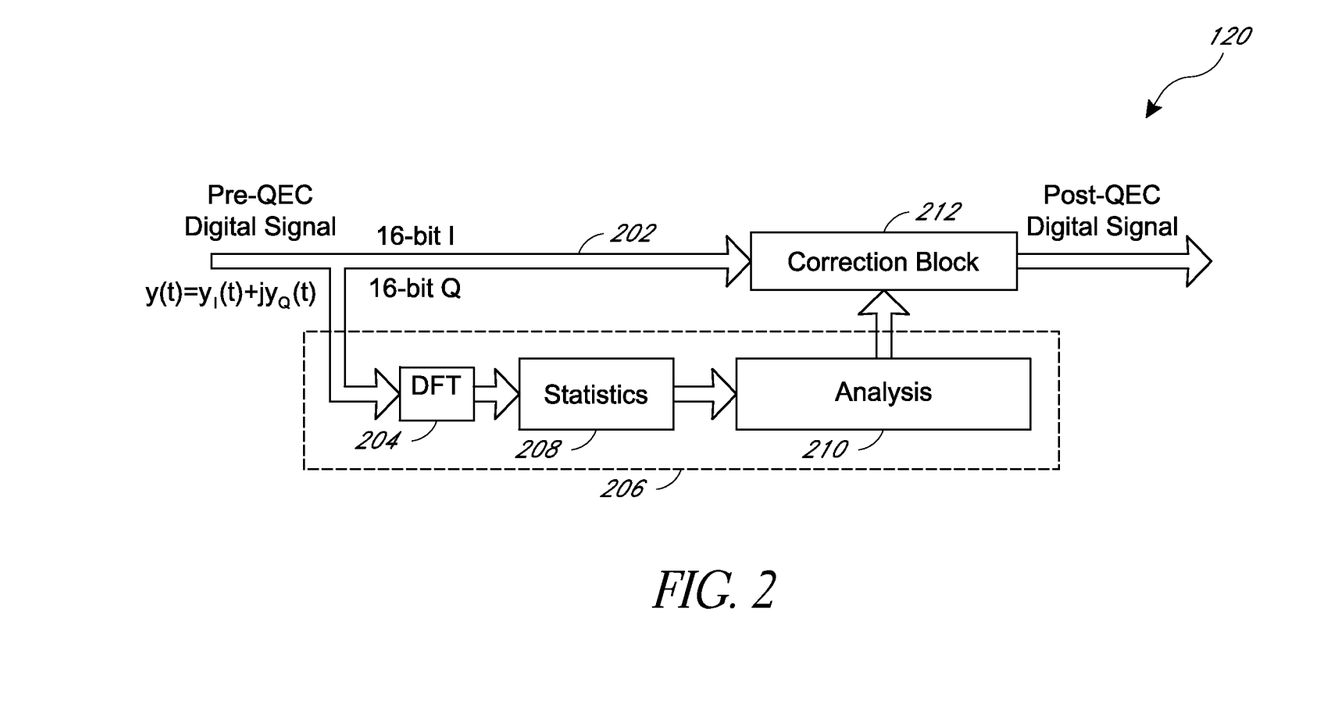
FIG. 2 is a schematic block diagram illustrating an example quadrature error estimator and corrector in accordance with one embodiment.

Referring to FIG. 2, the quadrature error corrector (QEC) 120 in FIG. 1 will be described below. The QEC 120 may comprise a pre-correction signal path 202, an error estimation block 206, and a correction block 212. The error estimation block 206 may further comprise a frequency transform block 204, a statistics module 208, and an analysis module 210. As will be explained later, the analysis module 210 estimates parameters A and φ, which are provided as inputs to the correction block 212 for correction of quadrature errors in the input signal y(t).

In one embodiment, the frequency transform block 204 may advantageously be a discrete Fourier transform (DFT) block that may use the Goertzel Algorithm. In an alternative embodiment, the frequency transform block 204 may use fast a Fourier transform (FFT). For the techniques disclosed herein, the computation of the DFT is computationally more efficient and consumes less chip area, thereby lowering costs. The time domain signal may be divided into segments, and the length of each segment may be determined by the desired frequency domain resolution. The frequency transform block 204 may output values corresponding to the frequency of the tone or narrowband signal and an image frequency that is of the opposite sign as the desired frequency. As in the example discussed in connection with FIG. 1, the frequency domain representation of the signal y(t) may be Y(f); therefore, the output of the frequency transform block may be expressed in terms of Y(f) and Y(−f). If the desired tone or narrowband signal is at frequency $f_0$, then the interested values may be expressed as $Y(f_0)$ and $Y(−f_0)$.

Based on the frequency domain model in this example, the signal-to-noise ratio (SNR) and the image rejection ratio (IRR) may be expressed as follows:

$$SNR(f) = \frac{E[|Z(f)G_1(f)|^2]}{E[|Z*(-f)G_2(f)|^2]} = \frac{\sigma^2(f)|G_1(f)|^2}{\sigma^2(-f)|G_2(f)|^2}$$

$$IRR(f) = \frac{E[|Z(f)G_1(f)|^2]}{E[|Z*(f)G_2(-f)|^2]}$$

where $\sigma^2(f)$ is the variance of Z(f).

The statistics module 208 may receive the frequency domain values from the frequency transform block 204 and determine one or more statistical parameters representative of the mismatch characteristics of the in-phase signal $y_I(t)$ and the quadrature-phase signal $y_Q(t)$. The analysis module takes in the one or more statistical parameters to determine the mismatch gain A and the combined phase mismatch phase φ resulting from the mismatch from the quadrature demodulator 104 and the in-phase and quadrature-phase signal paths 106 and 108 as discussed in connection with FIG. 1. The statistics module 208 and the analysis module 210 are described further in detail below in connection with FIG. 3.

Figure 3A:
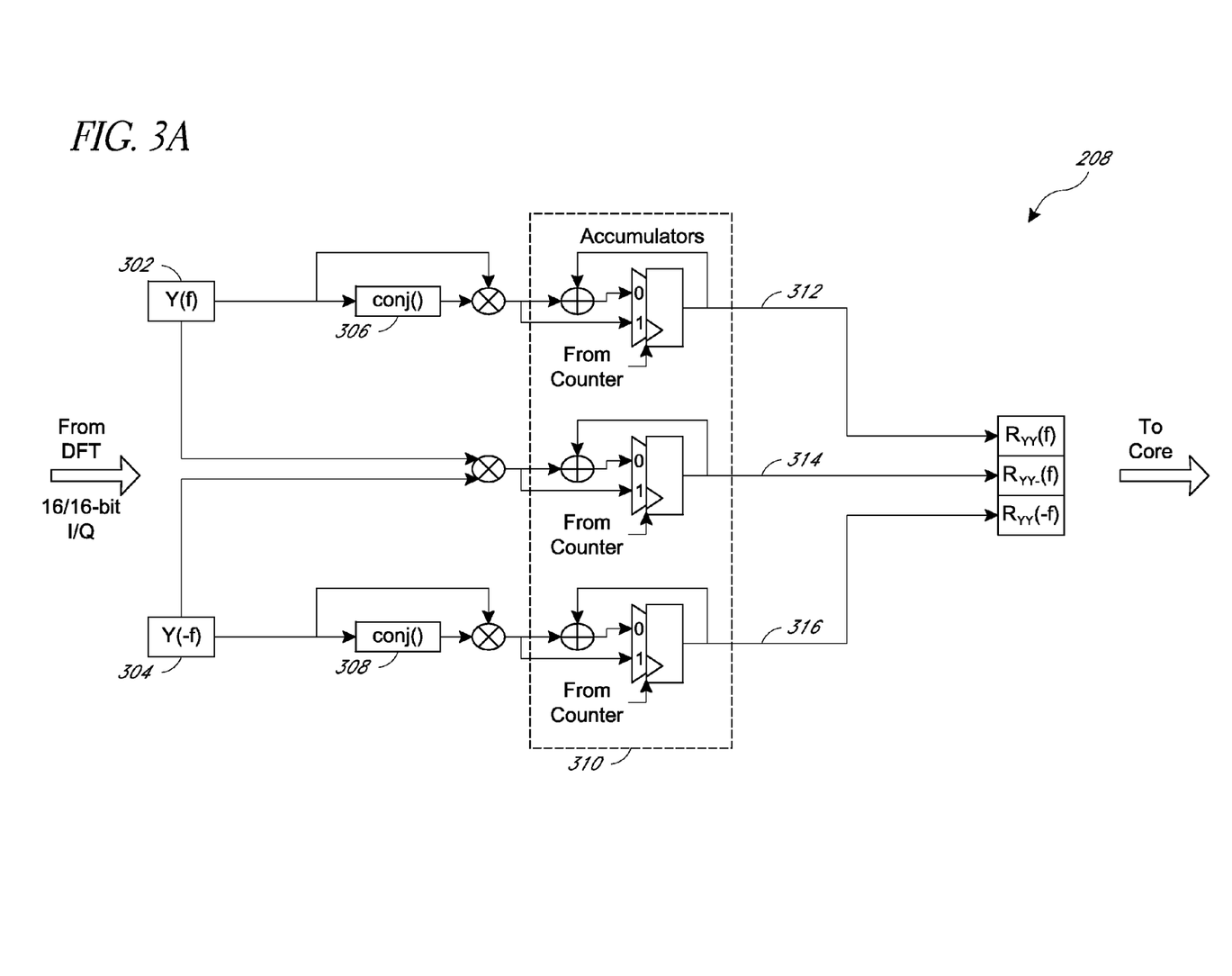
FIG. 3A is a schematic block diagram illustrating an example statistics module in accordance with one embodiment.

Referring to FIG. 3A, the statistics module 208 in FIG. 2 will be described below. The statistics module 208 may receive a positive frequency input 302 and a negative frequency input 304. The positive frequency input 302 may be processed through a conjugator 306 to generate a complex conjugate of the positive frequency input 302, and the negative frequency input 304 may be processed through a conjugator 308 to generate a complex conjugate of the negative frequency input 304. With the complex conjugates of the positive and negative frequency inputs 302 and 304 determined, squared magnitude values of the positive and negative frequency inputs 302 and 304 may be determined by multiplication of each frequency input with its complex conjugate. A product of the positive and negative frequency inputs 302 and 304 can also be performed.

Still referring to FIG. 3A, the accumulators 310 may accumulate the squared magnitude values of the positive and negative frequency inputs 302 and 304 and the product of the positive and negative frequency inputs 302 and 304 to determine expected values of each. The time interval for the accumulation can vary based on the noise level and how fast the analog channel changes. These expected values may constitute a plurality of statistical parameters that may be responsive to the mismatch between the in-phase signal $y_I(t)$ and the quadrature-phase signal $y_Q(t)$ in the example above. These expected values may be expressed as $R_{YY}(f)$, $R_{YY}(-f)$, and $R_{YY-}(f)$ and may be calculated as below:

$$R_{YY}(f) = E[|Y(f)|^2]$$
$$= E[(Z(f)G_1(f) + Z^*(-f)G_2(f))(Z^*(f)G_1^*(f) + Z(-f)G_2^*(f))]$$
$$= \sigma^2(f)G_1(f)G_1^*(f) + \sigma^2(-f)G_2(f)G_2^*(f)$$
$$= \frac{\sigma^2(f)}{4}(1 + e^{-j\phi}H_D(f) + e^{j\phi}H_D^*(f) + |H_D(f)|^2) +$$
$$\frac{\sigma^2(-f)}{4}(1 - e^{j\phi}H_D(f) - e^{-j\phi}H_D^*(f) + |H_D(f)|^2)$$
$$= \frac{\sigma^2(f)}{4}(1 + 2A(f)\cos(\theta(f) - \phi) + A(f)^2) +$$
$$\frac{\sigma^2(-f)}{4}(1 - 2A(f)\cos(\theta(f) + \phi) + A(f)^2)$$

$$R_{YY}(-f) = E[|Y(-f)|^2]$$
$$= \frac{\sigma^2(-f)}{4}(1 + 2A(f)\cos(\theta(f) + \phi) + A(f)^2) +$$
$$\frac{\sigma^2(f)}{4}(1 - 2A(f)\cos(\theta(f) - \phi) + A(f)^2)$$

$$R_{YY-}(f) = E[Y(f)Y(-f)]$$
$$= E[(Z(f)G_1(f) + Z^*(-f)G_2(f))(Z(-f)G_1(-f) + Z^*(f)G_2(-f))]$$
$$= \sigma^2(f)G_1(f)G_2(-f) + \sigma^2(-f)G_1(-f)G_2(f)$$
$$= \sigma^2(f)\frac{1}{2}(1 + e^{-j\phi}H_D(f))\frac{1}{2}(1 - e^{j\phi}H_D(-f)) +$$
$$\sigma^2(-f)\frac{1}{2}(1 + e^{-j\phi}H_D(-f))\frac{1}{2}(1 - e^{j\phi}H_D(f))$$
$$= \frac{\sigma^2(f)}{4}(1 - e^{-j\phi}H_D(f) - e^{j\phi}H_D^*(f) - |H_D(f)|^2) +$$
$$\frac{\sigma^2(-f)}{4}(1 + e^{-j\phi}H_D^*(f) - e^{j\phi}H_D(f) - |H_D(f)|^2)$$
$$= \frac{\sigma^2(f)}{4}(1 - A^2(f) + j2A(f)\sin(\theta(f) - \phi)) +$$
$$\frac{\sigma^2(-f)}{4}(1 - A^2(f) - j2A(f)\sin(\theta(f) + \phi))$$
$$= \frac{\sigma^2(f) + \sigma^2(-f)}{4}(1 - A^2(f)) + j\frac{A(f)}{2}\left(\begin{array}{c}\sigma^2(f)\sin(\theta(f) - \phi) + \\ \sigma^2(-f)\sin(-\theta(f) - \phi)\end{array}\right)$$
$$= \frac{\sigma^2(f) + \sigma^2(-f)}{4}(1 - A^2(f)) +$$
$$j\frac{A(f)}{2}\left(\begin{array}{c}\sigma^2(f)\sin(\theta(f) - \phi) + \\ \sigma^2(-f)\sin(\theta(f) - \phi - 2\theta(f))\end{array}\right)$$
$$\approx \frac{\sigma^2(f) + \sigma^2(-f)}{4}(1 - A^2(f)) +$$
$$j\frac{A(f)}{2}\left(\begin{array}{c}(\sigma^2(f) + \sigma^2(-f))\sin(\theta(f) - \phi) - \\ \sigma^2(-f)\cos(\theta(f) - \phi) \cdot 2\theta(f)\end{array}\right)$$

where the $R_{YY-}(f)$ is estimated using linear approximations such as $\sin(x) \approx x$ and $\cos(x) \approx 1$. Assuming that the desired signal is at frequency −f and the blocker is at frequency f, if the power of the desired signal $\sigma^2(-f)$ is relatively large, achieving a high IRR is not necessary to maintain the desired SNR. When $\sigma^2(-f)$ is relatively small, an accurate estimation of $\theta(f)-\phi$ is desirable, and it is known that $\theta(f)$ is much smaller than $\phi$. Therefore, assuming a relatively small $\sigma^2(-f) \approx 0$ and applying further linear approximations, $R_{YY-}(f)$ can be further estimated as below:

$$R_{YY-}(f) = E[Y(f)Y(-f)]$$

$$\approx \frac{\sigma^2(f) + \sigma^2(-f)}{4}(1 - A^2(f)) +$$

$$j\frac{A(f)}{2}((\sigma^2(f) + \sigma^2(-f))(\theta(f) - \phi))$$

$$= \frac{\sigma^2(f) + \sigma^2(-f)}{4}(1 - A^2(f)) + j\frac{A(f)}{2}((\sigma^2(f) + \sigma^2(-f))\varphi)$$

where $\phi$ is the combined phase mismatch from the LO 110 (FIG. 1) and the baseband phase errors as discussed in connection with FIG. 1 above.

In this example, the $R_{YY}(f)$ 312, $R_{YY}(-f)$ 316, and $R_{YY-}(f)$ 314 values may be provided as an input to the analysis module 210 (FIG. 2) from the statistics module 208. The analysis module 210 (FIG. 2) may further calculate estimates of the parameters A and $\phi$ discussed in connection with FIG. 1 above as follows:

$$A(f) = \sqrt{\frac{R_{YY}(f) + R_{YY}(-f) - 2 \cdot \text{Re}(R_{YY-}(f))}{R_{YY}(f) + R_{YY}(-f) + 2 \cdot \text{Re}(R_{YY-}(f))}}$$

$$\varphi(f) = \frac{1}{A(f)} \cdot \frac{-2 \cdot \text{Im}(R_{YY-}(f))}{R_{YY}(f) + R_{YY}(-f) + 2 \cdot \text{Re}(R_{YY-}(f))}$$

For a tone signal, the parameters A and $\phi$ may be deterministically computed as discussed above. For a narrowband signal, the parameters A and $\phi$ may be statistically computed. The statistical computation of A and $\phi$ for a narrowband signal, however, can be simplified because this narrowband implementation need not incorporate a frequency transform module with a wide range of frequencies. The resulting expressions for A and $\phi$ for a tone signal are also applicable to a narrowband signal as further discussed below.

For a narrowband signal, which has a narrow bandwidth around its center or carrier frequency $f_c$, rendering the $R_{YY}(f)$ 312, $R_{YY}(-f)$ 316, and $R_{YY-}(f)$ 314 values be approximated to constants, $R_{YY}(f_c)$ 312, $R_{YY}(-f_c)$ 316, and $R_{YY-}(f_c)$ 314 respectively. With the assumption of $\sigma^2(-f_c)=0$ as discussed above, the statistics for a narrowband signal can be simplified as follows:

$$R_{YY}(f_c) = \frac{\sigma^2(f_c)}{4}(1 + 2A(f_c)\cos(\theta(f_c) - \phi) + A(f_c)^2)$$

$$R_{YY}(-f_c) = \frac{\sigma^2(f_c)}{4}(1 - 2A(f_c)\cos(\theta(f_c) - \phi) + A(f_c)^2)$$

$$R_{YY-}(f_c) \approx \frac{\sigma^2(f_c)}{4}(1 - A^2(f_c)) + jA(f_c)\frac{\sigma^2(f_c)}{2}(\theta(f_c) - \phi)$$

For a tone signal, $z(t) = \sigma(f_c)e^{j(2\pi f_c t + \xi)}$, having the frequency $f_c$, a complex format of quadrature error can be as below:

$$y(t) = y_I(t) + jy_Q(t)$$

$$= \sigma(f_c)\cos(2\pi f_c t + \xi) + jA(f_c)\sigma(f_c)\sin(2\pi f_c t + \xi - \varphi)$$

where $\sigma(f_c)$ is the amplitude of the tone signal, $\xi$ is the initial phase, and $A(f_c)$ is the magnitude mismatch between I and Q channels. The combined phase mismatch $\phi=\phi-\theta(f_c)$ includes frequency independent phase mismatch $\phi$ and frequency dependent phase mismatch $\theta(f_c)$.

The signal y(t) above for a tone signal can be further expressed in relation to $g_1(t)$ and $g_2(t)$ discussed above in connection with FIG. 1 as below:

$$y(t) = y_I(t) + jy_Q(t)$$

$$= \sigma(f_c)\cos(2\pi f_c t + \xi) + jA(f_c)\sigma(f_c)\sin(2\pi f_c t + \xi - \varphi)$$

$$= \frac{\cos(2\pi f_c t + \xi) + jA(f_c)\sin(2\pi f_c t + \xi - \varphi)}{2}\sigma(f_c) +$$

$$\text{conj}\left(\frac{\cos(2\pi f_c + \xi) - jA(f_c)\sin(2\pi f_c t + \xi - \varphi)}{2}\sigma(f_c)\right)$$

$$= \frac{e^{j(2\pi f_c t+\xi)} + e^{-j(2\pi f_c t+\xi)} + A(f_c)(e^{j(2\pi f_c t+\xi-\varphi)} - e^{-j(2\pi f_c t+\xi-\varphi)})}{4}\sigma(f_c) +$$

$$\text{conj}\left(\frac{e^{j(2\pi f_c t+\xi)} + e^{-j(2\pi f_c t+\xi)} - A(f_c)\left(e^{j(2\pi f_c t+\xi-\varphi)} - e^{-j(2\pi f_c t+\xi-\varphi)}\right)}{4}\sigma(f_c)\right)$$

$$= \frac{(1 + A(f_c)e^{-j\varphi})e^{j(2\pi f_c t+\xi)} + (1 - A(f_c)e^{j\varphi})e^{-j(2\pi f_c t+\xi)}}{4}\sigma(f_c) +$$

$$\text{conj}\left(\frac{(1 - A(f_c)e^{-j\varphi})e^{j(2\pi f_c t+\xi)} + (1 + A(f_c)e^{j\varphi})e^{-j(2\pi f_c t+\xi)}}{4}\sigma(f_c)\right)$$

$$= \frac{(1 + A(f_c)e^{-j\varphi})e^{j(2\pi f_c t+\xi)} + (1 - A(f_c)e^{j\varphi})e^{-j(2\pi f_c t+\xi)}}{4}\sigma(f_c) +$$

$$\frac{(1 - A(f_c)e^{j\varphi})e^{-j(2\pi f_c t+\xi)} + (1 + A(f_c)e^{-j\varphi})e^{j(2\pi f_c t+\xi)}}{4}\sigma(f_c)$$

$$= \frac{(2 + 2A(f_c)e^{-j\varphi})e^{j(2\pi f_c t+\xi)} + (2 - 2A(f_c)e^{j\varphi})e^{-j(2\pi f_c t+\xi)}}{4}\sigma(f_c)$$

$$= \frac{1}{2}(1 + A(f_c)e^{-j\varphi})\sigma(f_c)e^{j(2\pi f_c t+\xi)} + \frac{1}{2}(1 - A(f_c)e^{j\varphi})\sigma(f_c)e^{-j(2\pi f_c t+\xi)}$$

$$= \frac{1}{2}(1 + A(f_c)e^{-j(\phi-\theta(f_c))})\sigma(f_c)e^{j(2\pi f_c t+\xi)} +$$

$$\frac{1}{2}(1 - A(f_c)e^{j(\phi-\theta(f_c))})\sigma(f_c)e^{-j(2\pi f_c t+\xi)}$$

where $\phi=\phi-\theta(f_c)$ as discussed above, $$\frac{1}{2}(1 + A(f_c)e^{-j(\phi-\theta(f_c))})$$

is the response of $g_1(t)$ at frequency $f_c$, and $$\frac{1}{2}(1 + A(f_c)e^{j(\phi-\theta(f_c))})$$

is the response of $g_2(t)$ at frequency $-f_c$. The frequency domain representation of y(t) is as below:

$$Y(f) = \delta(f - f_c)\sigma(f_c)e^{j\xi}G_1(f_c) + \delta(f + f_c)\sigma(f_c)e^{-j\xi}G_2(-f_c)$$

where $$G_1(f_c) = \frac{1}{2}(1 + A(f_c)e^{-j(\phi-\theta(f_c))})$$

and $$G_2(-f_c) = \frac{1}{2}(1 - A(f_c)e^{j(\phi-\theta(f_c))}).$$

Based on Y(f) of a tone signal discussed above, the statistics of a tone signal can be calculated as follows:

$$\begin{aligned}
R_{YY}(f_c) &= Y(f_c) \cdot Y^*(f_c) \\
&= \sigma(f_c)e^{j\xi}G_1(f_c) \cdot conj(\sigma(f_c)e^{j\xi}G_1(f_c)) \\
&= \frac{\sigma^2(f_c)}{4}(1 + A(f_c)e^{-j(\phi-\theta(f_c))}) \cdot (1 + A(f_c)e^{j(\phi-\theta(f_c))}) \\
&= \frac{\sigma^2(f_c)}{4}(1 + A(f_c)e^{-j(\phi-\theta(f_c))} + A(f_c)e^{j(\phi-\theta(f_c))} + A(f_c)^2) \\
&= \frac{\sigma^2(f_c)}{4}(1 + 2A(f_c)\cos(\phi - \theta(f_c)) + A(f_c)^2)
\end{aligned}$$

$$\begin{aligned}
R_{YY}(-f_c) &= Y(-f_c) \cdot Y^*(-f_c) \\
&= \sigma(f_c)e^{-j\xi}G_2(-f_c) \cdot conj(\sigma(f_c)e^{-j\xi}G_2(-f_c)) \\
&= \frac{\sigma^2(f_c)}{4}(1 - A(f_c)e^{j(\phi-\theta(f_c))}) \cdot (1 - A(f_c)e^{-j(\phi-\theta(f_c))}) \\
&= \frac{\sigma^2(f_c)}{4}(1 - A(f_c)e^{j(\phi-\theta(f_c))} - A(f_c)e^{-j(\phi-\theta(f_c))} + A(f_c)^2) \\
&= \frac{\sigma^2(f_c)}{4}(1 - 2A(f_c)\cos(\phi - \theta(f_c)) + A(f_c)^2)
\end{aligned}$$

$$\begin{aligned}
R_{YY-}(f_c) &= Y(f_c) \cdot Y(-f_c) \\
&= \sigma(f_c)e^{j\xi}G_1(f_c) \cdot \sigma(f_c)e^{-j\xi}G_2(-f_c) \\
&= \frac{\sigma^2(f_c)}{4}(1 + A(f_c)e^{-j(\phi-\theta(f_c))}) \cdot (1 - A(f_c)e^{j(\phi-\theta(f_c))}) \\
&= \frac{\sigma^2(f_c)}{4}(1 + A(f_c)e^{-j(\phi-\theta(f_c))} - A(f_c)e^{j(\phi-\theta(f_c))} - A(f_c)^2) \\
&= \frac{\sigma^2(f_c)}{4}(1 - A(f_c)^2 - j2A(f_c)\sin(\phi - \theta(f_c))) \\
&\approx \frac{\sigma^2(f_c)}{4}(1 - A^2(f_c)) + jA(f_c)\frac{\sigma^2(f_c)}{2}(\theta(f_c) - \phi)
\end{aligned}$$

As shown above, the statistics values $R_{YY}(f_c)$ 312, $R_{YY}(-f_c)$ 316, and $R_{YY-}(f_c)$ 314 can be same for both tone and narrowband modulated signals. These statistics values $R_{YY}(f_c)$ 312, $R_{YY}(-f_c)$ 316, and $R_{YY-}(f_c)$ 314 may be provided as an input to the analysis module 210 (FIG. 2) from the statistics module 208. Using these statistical values for both tone and narrowband modulated signals, the analysis module 210 (FIG. 2) may further calculate the parameters A and φ discussed in connection with FIG. 1 above for both tone and narrowband signals can be follows:

$$A(f_c) = \sqrt{\frac{R_{YY}(f_c) + R_{YY}(-f_c) - 2 \cdot \text{Re}(R_{YY-}(f_c))}{R_{YY}(f_c) + R_{YY}(-f_c) + 2 \cdot \text{Re}(R_{YY-}(f_c))}}$$

$$\varphi(f_c) = \frac{1}{A(f_c)} \cdot \frac{-2 \cdot \text{Im}(R_{YY-}(f_c))}{R_{YY}(f_c) + R_{YY}(-f_c) + 2 \cdot \text{Re}(R_{YY-}(f_c))}$$

where the parameters A and φ are constant for a given $f_c$ of the tone or narrowband signal.

The parameters A and φ determined in the analysis module 210 (FIG. 2) may be provided to the correction block 212 (FIG. 2). The correction block 212 (FIG. 2) may generate the post-QEC digital signals as discussed in connection with FIG. 3B below.

Figure 3B:
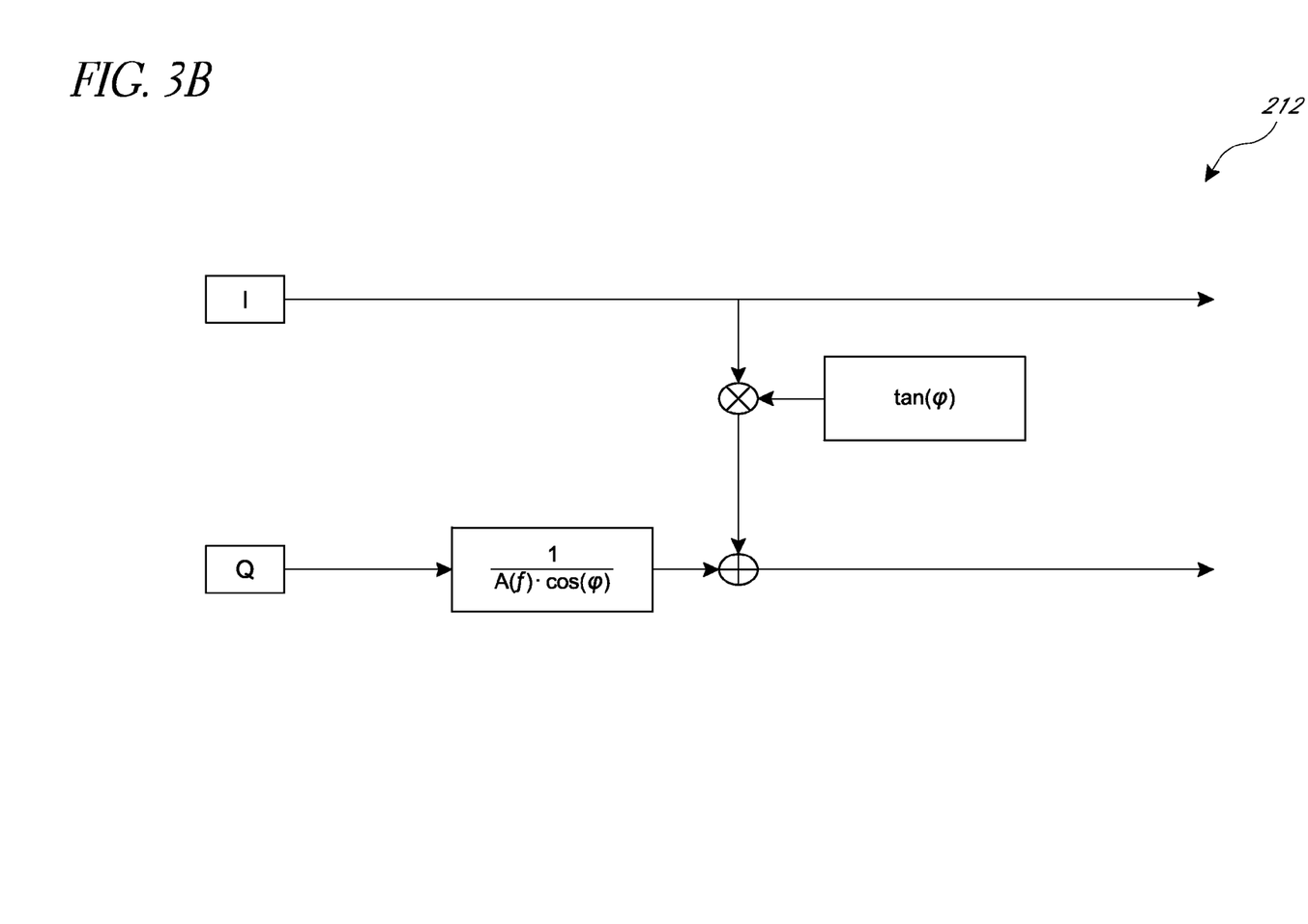
FIG. 3B is a schematic block diagram illustrating an example correction block in accordance with one embodiment.

FIG. 3B is a schematic block diagram illustrating an example correction block in accordance with one embodiment. The correction block 212 can receive pre-QEC in-phase and quadrature-phase digital signals through the pre-correction signal path 202 and the parameters A and φ from the analysis module 210 (FIG. 2) to generate post-QEC in-phase and quadrature-phase digital signals. The post-QEC signals from the correction block 212 can correct for the mismatch between the pre-correction in-phase and quadrature-phase signals using the parameters it receives from the analysis module 210 (FIG. 2). The mismatch terms are incorporated in the quadrature-phase signal model in the above discussed examples, and the example correction block 212 illustrated in FIG. 3B modifies the quadrature-phase signal. In other embodiments, input in-phase and quadrature-phase signals and errors may be modeled differently, for example, and a person of ordinary skill in the art may implement a correction block accordingly.

Figure 4A:
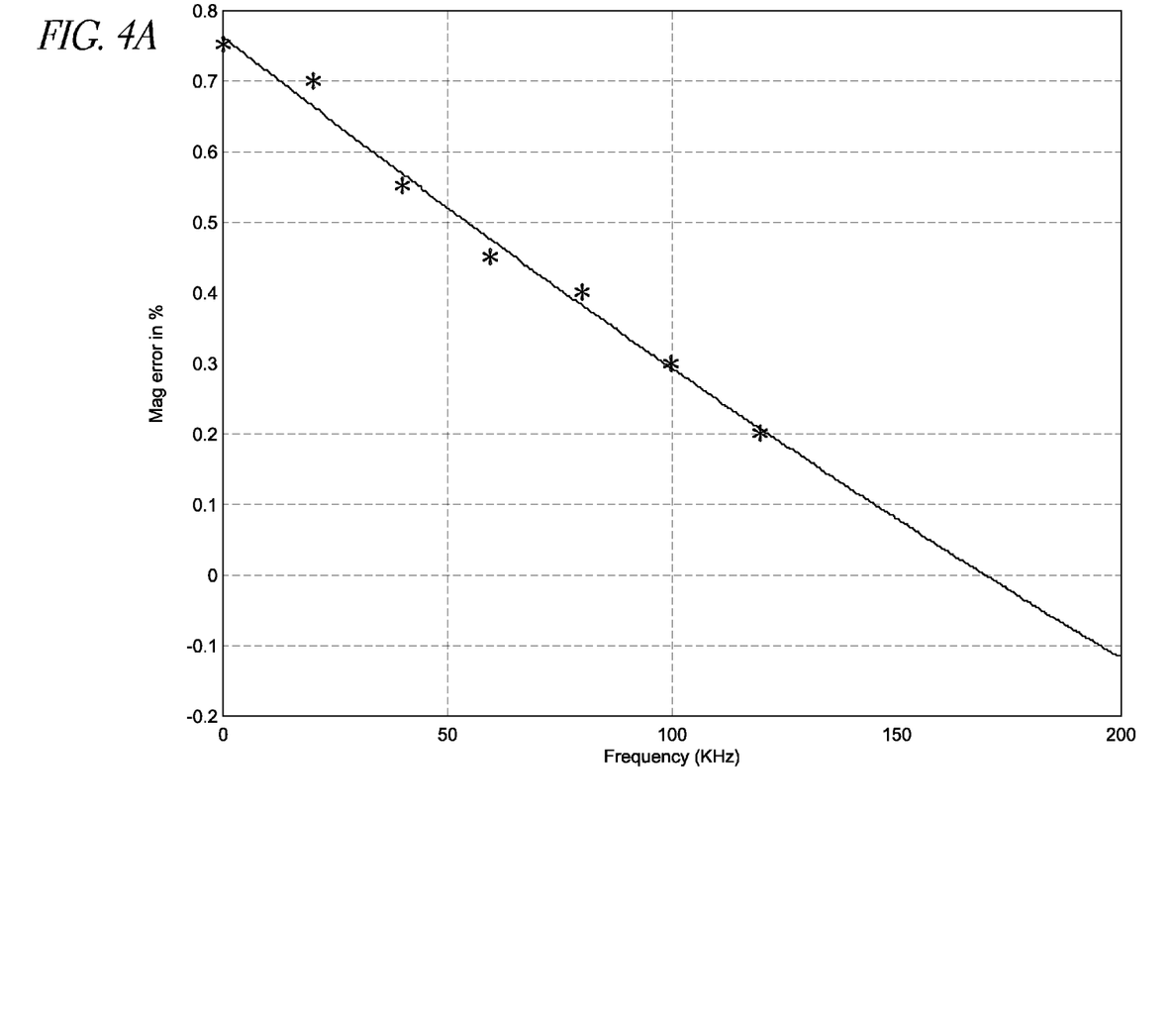
FIG. 4A is a graph illustrating an example analog channel magnitude error.

FIG. 4A illustrates simulation results of a magnitude error of an example analog channel from. The graph in FIG. 4A has incoming signal frequency in kHz on the x-axis and magnitude error due to the example analog channel in percentages on the y-axis. The seven points in the graph are measured errors, and the line in the graph illustrates an extrapolated model.

Figure 4B:
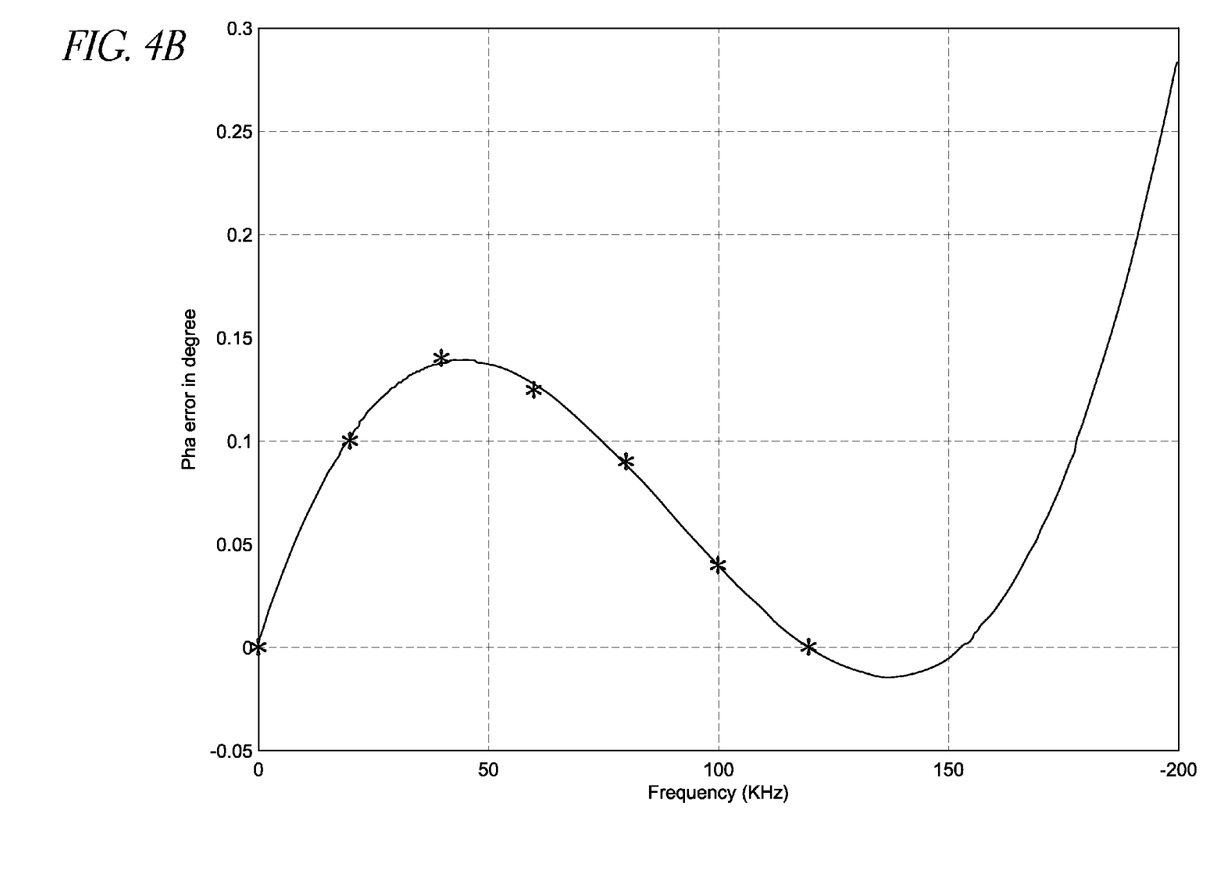
FIG. 4B is a graph illustrating an example analog channel phase error correction.

FIG. 4B illustrates simulation results of the phase error of the same example analog channel of FIG. 4A. The graph in FIG. 4B has incoming signal frequency in kHz on the x-axis and phase error due to the example analog channel in degrees on the y-axis. The seven points in the graph are measured simulated errors, and the line in the graph illustrates an extrapolated model. In addition to the example analog channel illustrated in FIGS. 4A and 4B, an example simulation setup includes a frequency deviation of 6.25 kHz, signal length for convergence of 1.28 milliseconds (ms), discrete Fourier transform performed on 93.75 kHz and 106.25 kHz, local oscillator magnitude error of 0.02%, and local oscillator phase error of −7 degree. The results of the simulation of the current disclosure under the abovementioned setup are described in connection with FIGS. 5A, 5B, and 6 below.

Figure 5A:
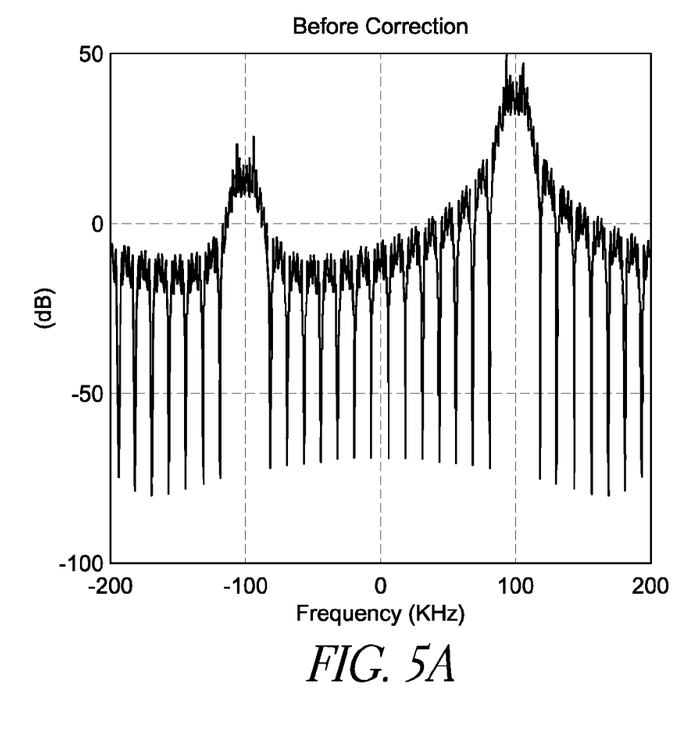
FIG. 5A is a graph illustrating an example signal frequency spectrum before error correction.

Referring to FIG. 5A, a frequency spectrum of an example signal received through the analog channel of FIGS. 4A and 4B before error correction will be described below. In the graph of FIG. 5A, received signal frequency in kHz is on the x-axis, and received signal magnitude in decibels (dB) is on the y-axis. As illustrated in FIG. 5A, the received signal has a frequency of about 100 kHz, and without correction according to an embodiment of this disclosure, there is an image of the desired signal at around −100 kHz.

Figure 5B:
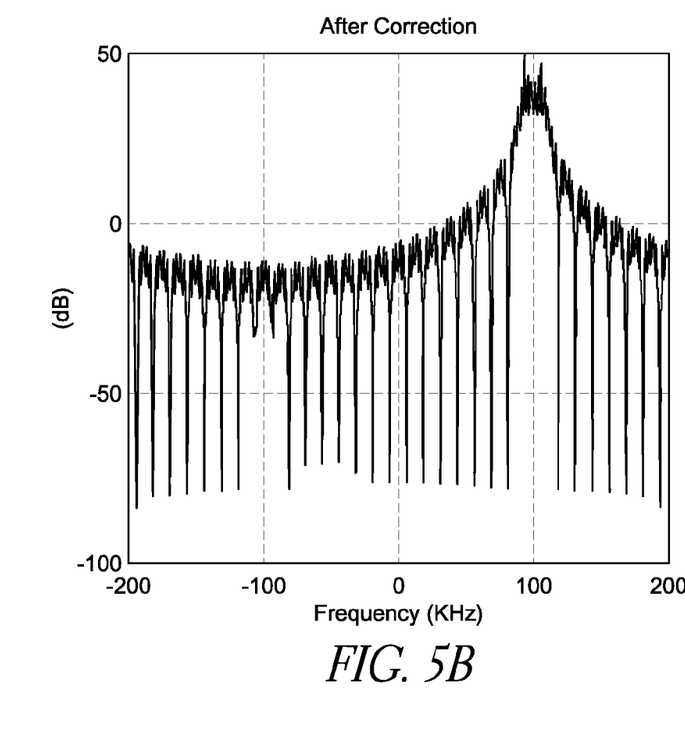
FIG. 5B is a graph illustrating an example signal frequency spectrum after quadrature error correction in accordance with one embodiment.

Referring to FIG. 5B, a frequency spectrum of the example signal of FIG. 5A after quadrature error correction will be described below. In the graph of FIG. 5B, received signal frequency in kHz is on the x-axis, and received signal magnitude in dB is on the y-axis. As illustrated in FIG. 5B, the received signal has a frequency of about 100 kHz, and with quadrature error correction according to one embodiment of this disclosure, there is no image of the desired signal at around −100 kHz.

Figure 6:
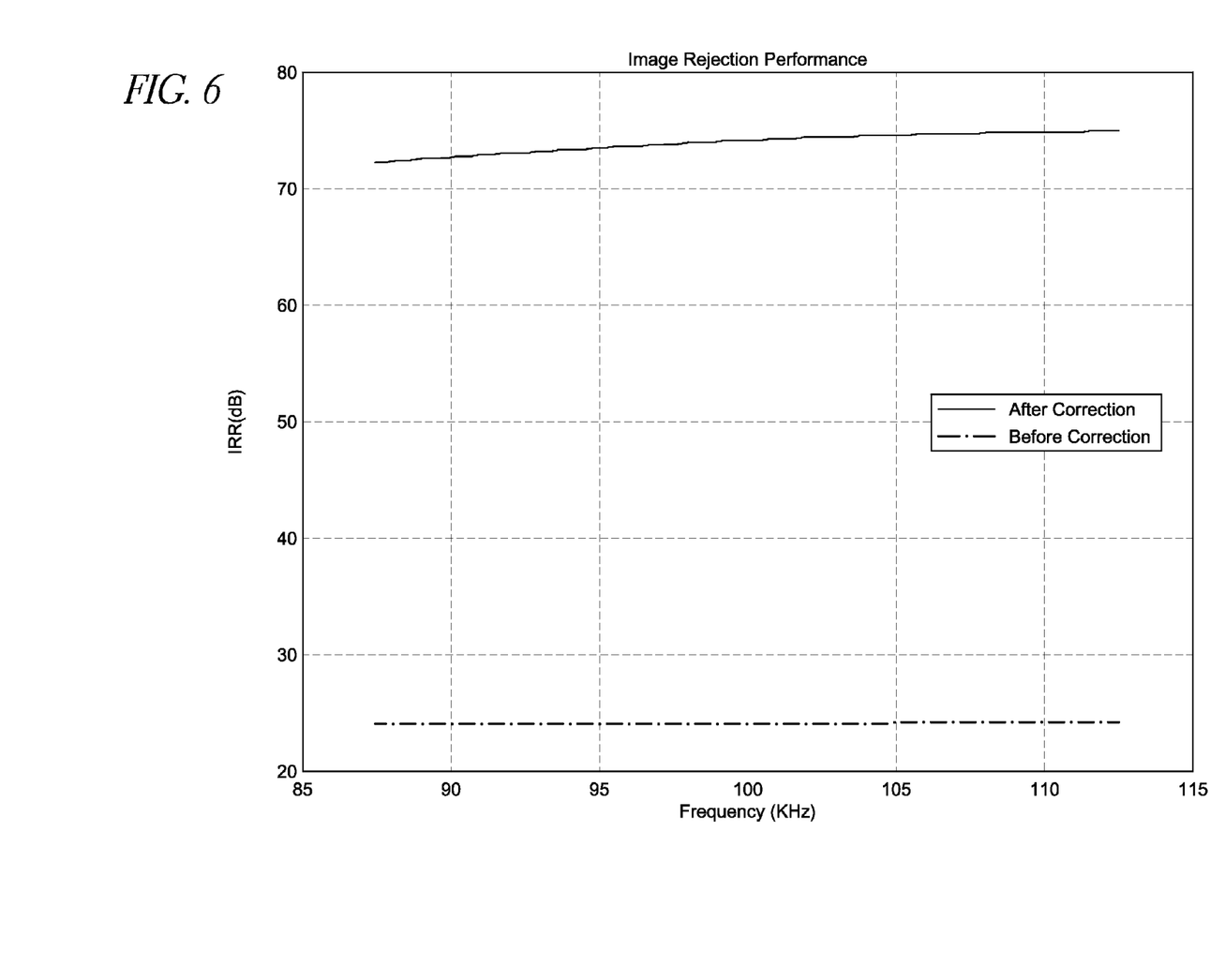
FIG. 6 is a graph illustrating an example image rejection comparison between before and after quadrature error correction in accordance with one embodiment.

Referring to FIG. 6, image rejection of the example signal of FIGS. 5A and 5B before and after quadrature error correction will be described below. In the graph of FIG. 6, received signal frequency in kHz is on the x-axis, and image rejection ratio in dB is on the y-axis. As illustrated in FIG. 6, before correction, image rejection ratio throughout the depicted frequencies is only around 24 dB. However, after quadrature error correction according to one embodiment of this disclosure, image rejection ratio throughout the same frequency range goes above 71 dB. In some embodiments, the improvement in image rejection ratio can be more than 47 dB.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like. Further, a "channel width" as used herein may encompass or may also be referred to as a bandwidth in certain aspects.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

Applications

Furthermore, the disclosed methods, systems, and/or apparatus can be implemented into various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, wireless devices, a mobile phone, cellular base stations, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. The communication networks can include, but not limited to, Smart Utility Networks based on the IEEE 802.15.4g standard. Further, the electronic device can include unfinished products.

It is to be understood that the implementations are not limited to the precise configuration and components illustrated above. Various modifications, changes and variations may be made in the arrangement, operation and details of the methods and apparatus described above without departing from the scope of the implementations.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well.

What is claimed is:

1. An apparatus for processing a modulated signal, the apparatus comprising:
   a quadrature demodulator configured to receive the modulated signal and generate an in-phase signal for a first signal path and a quadrature-phase signal for a second signal path; and
   one or more signal processors configured to:
      perform discrete Fourier transform to generate one or more frequency domain values based on the in-phase signal from the first path and the quadrature-phase signal from the second path;
      determine a plurality of statistical parameters responsive to one or more mismatch characteristics between the in-phase signal and the quadrature-phase signal based at least partly on the one or more frequency domain values;
      determine the one or more mismatch characteristics based on the plurality of statistical parameters; and
      reduce quadrature error based on the one or more mismatch characteristics,
   wherein the plurality of statistical parameters include one or more expected values indicating relationships between one or more positive and negative frequency components of the in-phase signal and the quadrature-phase signal.

2. The apparatus in claim 1, wherein the modulated signal is a narrowband signal or a tone signal.

3. The apparatus in claim 2, wherein the modulated signal is a tone signal and the one or more signal processors are further configured to generate parameters for reduction of quadrature error in a deterministic manner based at least partly on observations of frequency components of the in-phase signal and the quadrature-phase signal.

4. The apparatus in claim 1, wherein the one or more signal processors are configured to reduce quadrature error by modifying the in-phase signal and/or the quadrature-phase signal to generate a modified in-phase signal and/or a modified quadrature-phase signal.

5. The apparatus in claim 1, wherein the one or more mismatch characteristics include at least one of a phase mismatch and an amplitude mismatch.

6. The apparatus in claim 5, wherein determining of the one or more mismatch characteristics comprises approximating the one or more mismatch characteristics.

7. The apparatus in claim 6, wherein approximating comprises linear approximation.

8. The apparatus in claim 1, wherein the one or more processors are configured to generate the one or more frequency domain values based on Goertzel Algorithm processing.

9. The apparatus in claim 1 comprising a bandpass filter having a bandwidth in which a channel mismatch is treated as a constant for analysis.

10. The apparatus in claim 1, wherein the one or more mismatch characteristics comprises:
a gain mismatch A determined according to $$A(f) = \sqrt{\frac{R_{YY}(f) + R_{YY}(-f) - 2 \cdot \text{Re}(R_{YY-}(f))}{R_{YY}(f) + R_{YY}(-f) + 2 \cdot \text{Re}(R_{YY-}(f))}};$$

and
a phase mismatch φ determined according to $$\varphi(f) = \frac{1}{A(f)} \cdot \frac{-2 \cdot \text{Im}(R_{YY-}(f))}{R_{YY}(f) + R_{YY}(-f) + 2 \cdot \text{Re}(R_{YY-}(f))},$$

where f is a tone frequency or a center or carrier frequency of the modulated signal,
wherein $R_{YY}(f)$ indicates an expected value of a positive frequency input,
wherein $R_{YY}(-f)$ indicates an expected value of a negative frequency input,
wherein $R_{YY-}(f)$ indicates an expected value of a product of the positive and negative frequency inputs.

11. A method for processing a modulated signal, the method comprising:
receiving the modulated signal and generating an in-phase signal for a first signal path and a quadrature-phase signal for a second signal path;
generating one or more frequency domain values based on the in-phase signal from the first path and the quadrature-phase signal from the second path;
determining a plurality of statistical parameters responsive to one or more mismatch characteristics between the in-phase signal and the quadrature-phase signal based at least partly on the one or more frequency domain values;
determining the one or more mismatch characteristics based on the plurality of statistical parameters; and
correcting the in-phase signal and/or the quadrature-phase signal based on the one or more mismatch characteristics to reduce quadrature error,
wherein the plurality of statistical parameters include one or more expected values indicating relationships between one or more positive and negative frequency components of the in-phase signal and the quadrature-phase signal.

12. The method in claim 11, wherein the modulated signal is a narrowband signal or a tone signal.

13. The method in claim 11, wherein the modulated signal is a tone signal and generating the one or more frequency domain values comprises a deterministic computation based at least partly on observations of frequency components of the in-phase signal and the quadrature-phase signal.

14. The method in claim 11, wherein correcting the in-phase signal and/or the quadrature-phase signal comprises receiving the one or more mismatch characteristics to modify the in-phase signal and/or the quadrature-phase signal and to generate a modified in-phase signal and/Or a modified quadrature-phase signal to reduce the quadrature error.

15. The method in claim 11, wherein the one or more mismatch characteristics include at least one of a phase mismatch and an amplitude mismatch.

16. The method in claim 15, wherein determining of the one or more mismatch characteristics comprises approximating the one or more mismatch characteristics.

17. The method in claim 16, wherein approximating comprises linear approximation.

18. The method in claim 11 further comprising generating the one or more frequency domain values based on Goertzel Algorithm processing.

19. The method in claim 11 further comprising filtering the modulated signal with a bandpass filter having a bandwidth in which the channel mismatch is treated as a constant for analysis.

20. The method in claim 11, wherein the one or more mismatch characteristics comprises:
a gain mismatch A determined according to $$A(f) = \sqrt{\frac{R_{YY}(f) + R_{YY}(-f) - 2 \cdot \text{Re}(R_{YY-}(f))}{R_{YY}(f) + R_{YY}(-f) + 2 \cdot \text{Re}(R_{YY-}(f))}};$$

and
a phase mismatch φ determined according to $$\varphi(f) = \frac{1}{A(f)} \cdot \frac{-2 \cdot \text{Im}(R_{YY-}(f))}{R_{YY}(f) + R_{YY}(-f) + 2 \cdot \text{Re}(R_{YY-}(f))},$$

where f is a tone frequency or a center of carrier frequency of the modulated signal,
wherein $R_{YY}(f)$ indicates an expected value of a positive frequency input,
wherein $R_{YY}(-f)$ indicates an expected value of a negative frequency input,
wherein $R_{YY-}(f)$ indicates an expected value of a product of the positive and negative frequency inputs.

* * * * *